(12) United States Patent
Awazu et al.

(10) Patent No.: US 7,554,059 B2
(45) Date of Patent: Jun. 30, 2009

(54) HEATER UNIT AND SEMICONDUCTOR MANUFACTURING APPARATUS INCLUDING THE SAME

(75) Inventors: Tomoyuki Awazu, Itami (JP); Akira Mikumo, Itami (JP); Masuhiro Natsuhara, Itami (JP); Hirohiko Nakata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/518,878

(22) Filed: Sep. 12, 2006

(65) Prior Publication Data

US 2007/0056953 A1    Mar. 15, 2007

(30) Foreign Application Priority Data

Sep. 12, 2005    (JP) .............................. 2005-263183

(51) Int. Cl.
*H05B 3/68* (2006.01)
*F26B 19/00* (2006.01)

(52) U.S. Cl. ............ 219/444.1; 219/443.1; 219/448.11; 219/448.17; 392/416; 392/418; 118/724; 118/725; 118/50.1; 118/729; 118/728; 118/730

(58) Field of Classification Search .................. 219/390, 219/405, 411, 444.1, 443.1, 448.17; 392/416, 392/418; 118/724–5, 728–30
See application file for complete search history.

(56) References Cited

U.S. PATENT DOCUMENTS 5,509,471 A * 4/1996 Hallgren ..................... 165/167
6,084,215 A * 7/2000 Furuya et al. ............. 219/444.1
6,097,006 A * 8/2000 Inukai ......................... 219/497
6,646,233 B2 * 11/2003 Kanno et al. ................. 219/390

FOREIGN PATENT DOCUMENTS

| JP | 9-162578 A | 6/1997 |
|---|---|---|
| JP | 2002-69652 | 3/2002 |
| JP | 2002-508587 | 3/2002 |
| JP | 2004-14655 A | 1/2004 |
| JP | 2004-356555 A | 12/2004 |
| JP | 2005-150506 A | 6/2005 |
| JP | 2005-209981 A | 8/2005 |
| WO | WO 99/49501 | 9/1999 |

OTHER PUBLICATIONS

Japanese Office Action issued in corresponding Japanese Patent Application No. JP 2005-263183, dated Feb. 20, 2007.
Japanese Office Action issued in corresponding Japanese Patent Application No. JP 2005-263183, dated Nov. 28, 2006.

* cited by examiner

*Primary Examiner*—Shawntina Fuqua
(74) *Attorney, Agent, or Firm*—McDermott Will & Emery LLP

(57) ABSTRACT

A ceramic heater attaining more uniform temperature distribution from the start to the end of cooling is provided. Further, in a cooling module used for cooling the heater, liquid leakage during use is prevented, degradation in cooling capability is prevented and the performance is maintained for a long period of use, and the manufacturing cost of the module is decreased. The ceramic heater includes a ceramic heater body and a cooling module cooling the heater body, and the cooling module has a structure formed by arranging a pipe in a trench formed in a plate-shaped structure.

21 Claims, 2 Drawing Sheets

US 7,554,059 B2

HEATER UNIT AND SEMICONDUCTOR MANUFACTURING APPARATUS INCLUDING THE SAME

This nonprovisional application is based on Japanese Patent Application No. 2005-263183 filed with the Japan Patent Office on Sep. 12, 2005, the entire contents of which are hereby incorporated by reference.

BACKGROUND OF THE INVENTION

1. Field of the Invention

The present invention relates to a ceramic heater provided with a heater body formed of ceramics on which an object of processing is placed for heat treatment and a cooling module including plate-shaped structure for cooling the heater body, as well as to a semiconductor manufacturing apparatus having the ceramic heater mounted thereon.

2. Description of the Background Art

Conventionally, in the process of manufacturing a semiconductor, a semiconductor substrate (wafer) as an object of processing is subjected to various processes including film formation and etching. In a semiconductor manufacturing apparatus used for performing such processes on the semiconductor substrate, a ceramic heater is used for holding and heating the semiconductor substrate.

By way of example, in the photolithography process, a resist film pattern is formed on a wafer. In this process, steps of washing the wafer, heating and drying, cooling, thereafter applying a resist film on the wafer surface, placing the wafer on a ceramic heater in a photolithography processing apparatus, drying, and thereafter exposure and development are performed. In the photolithography process, temperature at the time of drying the resist has significant influence on the quality of the applied film, and therefore, uniformity of the temperature of ceramic heater during processing is important.

Further, for improving throughput, these process steps on the wafer must be finished in as short a time as possible. Therefore, the inventors of the present invention have proposed semiconductor manufacturing apparatuses having cooling means capable of cooling the heated heater in a short period of time. By way of example, Japanese Patent Laying-Open No. 2004-014655 proposes a semiconductor manufacturing apparatus including a plate-shaped structure that can be brought into contact with and separated from a surface opposite to the wafer-mounting surface of the heater. Japanese Patent Laying-Open No. 2005-150506 proposes a semiconductor manufacturing apparatus in which a passage for a cooling liquid is formed in the plate-shaped structure so that cooling rate is further increased and uniformity in temperature distribution of the heater can be maintained from the start to the end of cooling.

In the process of manufacturing semiconductors including recent electronic devices, higher uniformity of temperature distribution of the heater has been required. Higher uniformity of heater temperature distribution is required from the start to the end of cooling, not to mention during heating and holding at the heated temperature. Further, increase in the rate of temperature increase and the rate of cooling is also required.

Recent semiconductors come to have thinner interconnections, and accordingly, KrF or ArF has come to be used as a light source for exposure in the photolithography process, and a chemical amplification film is used as the resist film. In this process, acid generated at the time of exposure serves as a catalyst, so that the resist film is made soluble in the following step of development, that is, the film can be washed away. In the photolithography process, strict control of temperature variation is necessary, for example, in the step of PBA (Post Applied Baking) in which the resist film is spin-coated and thereafter a solvent is evaporated before exposure to increase viscosity and to prevent flow during exposure, and in the step of PEB (Post Exposure Baking) in which the resist film is cured after exposure.

It is often the case that the heater temperature is changed for processing in these PAB and PEB steps. For instance, after processing at 180° C., the heater temperature may be lowered by 50° C. for processing at 130° C. In such a case, it has been required to attain uniform heater temperature distribution as soon as possible after the start of cooling, in order to increase throughput.

In the conventional semiconductor manufacturing apparatus described above, a cooling module has been proposed in which a passage 15 for circulating a cooling liquid is formed in a plate-shaped structure 14, so that the cooling rate is further improved and the uniformity of heater temperature can be maintained from the start to the end of cooling, as shown, for example, in FIG. 7. The apparatus, however, becomes expensive as passage 15 must be fabricated through machine processing, and the apparatus cannot be provided at a low cost. Further, dependent on the material of plate-shaped structure 14, the structure may be corroded by the fluid, possibly causing leakage of the fluid, and therefore, it is not very reliable and use for a long period has been difficult. When a material highly resistant to corrosion is used for plate-shaped structure 14, it becomes prohibitively expensive.

SUMMARY OF THE INVENTION

In view of such conditions of the prior art, an object of the present invention is to provide a ceramic heater that can attain more uniform heater temperature distribution from the start to the end of cooling and to provide a semiconductor manufacturing apparatus having the heater mounted thereon. A further object is, in a cooling module used for cooling the heater, to prevent liquid leakage during use, to prevent degradation in cooling capability and to maintain performance for a long period of use, and to decrease the manufacturing cost of the module.

In order to attain the above-described objects, the present invention provides a ceramic heater, including: a heater body formed of ceramics on which an object to be processed is mounted and heated; and a cooling module brought into contact with the heater body for cooling the heater body; wherein the cooling module is formed by combining a plate-shaped structure that is brought into contact with the heater body and a pipe allowing circulation of a fluid. As the cooling module is configured by combining the plate-shaped structure and the pipe that allows circulation of a fluid, reliability can be improved while the cost can be reduced.

In the ceramic heater of the present invention described above, the cooling module has such a structure that a trench is formed in the plate-shaped structure and the pipe is arranged in the trench, whereby the cooling capability of the cooling module can be enhanced and the cooling rate of the heater body can be increased. When the depth of the trench formed in the plate-shaped structure of the cooling module is made to be at least the outer radius of the pipe, the cooling capability of the cooling module can be enhanced and the cooling rate of the heater body can be increased. Further, when the difference between the width of the trench formed in the plate-shaped structure of the cooling module and the outer diameter of the pipe is set to be 0.2 to 1.0 mm, the cooling capability of the cooling module can be enhanced and the cooling rate of the heater body can be increased.

The cooling module can be formed at a low cost by holding the pipe with a metal plate and by fixing the metal plate on the plate-shaped structure by a screw. Further, by managing by torque the fastening of the screw fixing the metal plate, high reliability can be attained and, particularly, it is preferred to fasten the screw fixing the metal plate at a torque of at least 30 cN·m. Further, by using stainless steel, copper, aluminum, iron or an alloy containing any of these as the metal plate, a highly reliable cooling module can be provided at a low cost.

In the cooling module of the ceramic heater in accordance with the present invention described above, a contact portion between the plate-shaped structure and the pipe may be caulked. Caulking prevents water as the cause of corrosion from entering a gap between the plate-shaped structure and the pipe, and therefore, corrosion can be suppressed and the cooling module of higher reliability can be provided.

When the pipe in the cooling module is formed of metal, a highly reliable cooling module can be provided at a low cost. Further, when a connector formed of metal is brazed to a tip end of the metal pipe, a highly reliable cooling module can be provided at a low cost. When copper, stainless steel, aluminum, iron or an alloy containing any of these as a main component is used for the metal pipe, a cooling module having high cooling capability can be provided at a low cost. Further, when an outer circumferential surface of the metal pipe is provided with plating containing any of nickel, zinc, gold or phosphor, a cooling module of higher reliability can be provided.

On the other hand, when the plate-shaped structure of the cooling module is formed of metal, a cooling module having high cooling capability can be provided at a low cost. Specifically, when aluminum, iron, copper or an alloy containing any of these as a main component is used for the plate-shaped structure, a cooling module having higher cooling capability can be provided at a lower cost. The plate-shaped structure may be formed of ceramics, and in that case, corrosion can be prevented. Therefore, a highly reliable cooling module can be provided at a low cost.

In the ceramic heater in accordance with the present invention as described above, when a sum of flatness of a contact surface of the heater body to the plate-shaped structure and flatness of a contact surface of the plate-shaped structure to the heater body is set to at most 0.8 mm, a cooling module having superior cooling capability can be obtained. In the cooling module, the pipe may be arranged spirally or arranged in continuous, alternating U-shapes, whereby a cooling module having superior cooling capability can also be obtained.

In the ceramic heater in accordance with the present invention as described above, preferably, the main component of a base member of the heater body is any of aluminum nitride, silicon nitride, silicon carbide, aluminum oxide and aluminum oxinitride, and more preferably, the main component is aluminum nitride.

In the ceramic heater in accordance with the present invention as described above, preferably, the heater body and/or the cooling module is contained in a metal container. Further, the present invention provides a semiconductor manufacturing apparatus having the above-described ceramic heater mounted thereon.

By the present invention, a ceramic heater enabling highly uniform temperature distribution of the heater body from the start to the end of cooling, as well as a semiconductor manufacturing device mounting the heater can be provided. Therefore, in the semiconductor manufacturing process, particularly in the photolithography process, high quality production at high throughput becomes possible. Further, leakage of fluid during use of the cooling module used for cooling the heater body can be prevented, the cooling capability of the module is not degraded but maintained even when used for a long period of time, and the manufacturing cost of the module can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<Ceramic Heater>

Figure 1:
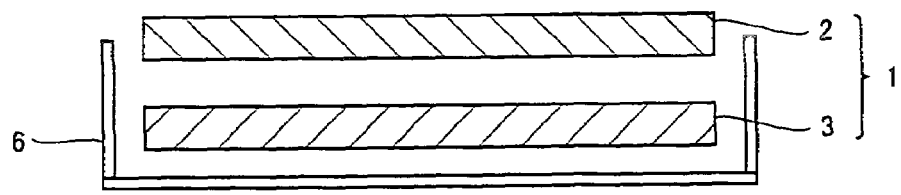
FIG. 1 is a schematic cross-section showing a specific example of a ceramic heater including a heater body and a cooling module in accordance with the present invention.

The ceramic heater of the present invention will be described with reference to FIG. 1. A ceramic heater 1 in accordance with the present invention includes a heater body 2 heating a semiconductor wafer as an object of processing, mounted on a wafer-mounting surface, and a cooling module 3 which can be in contact with the side (rear surface) opposite to the wafer-mounting surface of heater body 2 for cooling heater body 2. Heater body 2 is supported at an opening portion of a container 6 by a supporting leg (not shown) or the like, and cooling module 3 is adapted to be brought into contact with and separated from heater body 2 by elevating means (not shown) such as an air cylinder.

Further, ceramic heater 1 can be mounted on a semiconductor manufacturing apparatus. In that case, heater body 2 and cooling module 3 are contained and supported by metal container 6, as shown in FIG. 1. As heater body 2 and/or cooling module 3 is contained in metal container 6, external influence to the temperature of ceramic heater 1 is significantly reduced, and a ceramic heater having good temperature distribution both in heating and cooling can be obtained.

Generally, in the semiconductor manufacturing process, a ceramic heater is basically used with the temperature maintained at a constant value. In the above-described PAB process or PEB process that takes place during the semiconductor manufacturing process, it is often the case that the heater temperature is changed for processing. For instance, after processing at 180° C., the heater body temperature may be lowered by 50° C. for processing at 130° C. In order to improve throughput even in such a situation, the temperature distribution of the heater body must be made uniform as fast as possible after the start of cooling.

In order to meet the demand, it is necessary to increase cooling rate when the temperature is lowered. For this purpose, it is very effective to have the cooling module brought into contact with the heater body of the ceramic heater to increase the cooling rate. Further, circulating a fluid through the cooling module is effective in order to keep the temperature of cooling module low before bringing it into contact and to suppress temperature increase of the cooling module after contact with the heater body. The fluid may be water or other substance. To realize a temperature not higher than 0° C., use of other fluid is necessary.

(Cooling Module)

Figure 2:
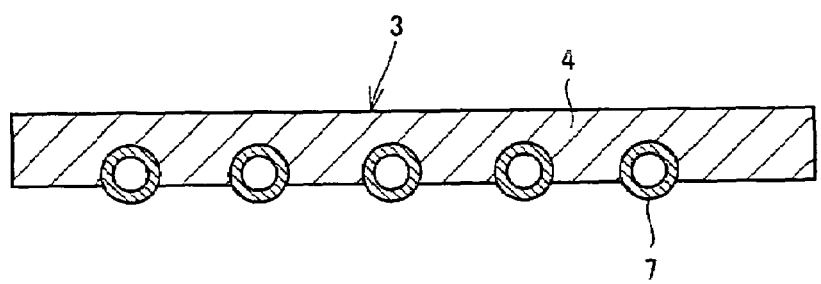
FIG. 2 is a schematic cross-section showing a cooling module of the ceramic heater in accordance with the present invention.

For circulation of a fluid through the cooling module, cooling module 3 of the present invention is formed by combining a plate-shaped structure 4 which can be in contact with heater body 2 and a pipe 7 allowing circulation of the fluid, as shown, for example, in FIG. 2. The structure having plate-shaped structure 4 and pipe 7 combined and in contact is advantageous in that a highly reliable cooling module can be fabricated at a low cost, as compared with a conventional method in which the plate-shaped structure is processed to provide a passage for circulating a fluid therein.

Figure 3:
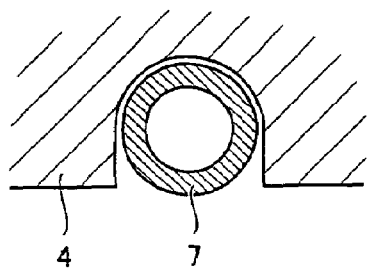
FIG. 3 is a schematic cross-section showing a specific example of a main portion of the cooling module in accordance with the present invention.

Particularly, when a trench is formed in plate-shaped structure 4 and pipe 7 is arranged in the trench as shown in FIG. 2, cooling capability of cooling module 3 can be enhanced and cooling rate of heater body 2 can be increased. The trench of plate-shaped structure 4 is generally formed on a surface of plate-shaped structure 4 opposite to the surface to be in contact with heater body 2. Further, the depth of trench formed in plate-shaped structure 4 is preferably the same or deeper than the outer radius of pipe 7 to be fitted in the trench, as shown in FIG. 2. More preferably, the depth of trench formed in plate-shaped structure 4 is approximately the same as the outer diameter of pipe 7, as shown in FIG. 3. As a result, contact surface between pipe 7 and plate-shaped structure 4 can be made large, heat is transferred more easily from plate-shaped structure 4 to pipe 7, and cooling capability of cooling module 3 can be enhanced. Therefore, heater body 2 can more quickly be cooled.

Preferably, the difference between the width of trench formed in plate-shaped structure 4 and the outer diameter of pipe 7 is 0.2 to 1.0 mm. This further facilitates heat transfer from plate-shaped structure 4 to pipe 7 and cooling capability of cooling module 3 can be enhanced. Therefore, heater body 2 can more quickly be cooled. If the difference between the width of trench formed in plate-shaped structure 4 and the outer diameter of pipe 7 is smaller than 0.2 mm, clearance is so small that fitting of pipe 7 would be difficult and the surface of pipe 7 would possibly be damaged. If the difference exceeds 1.0 mm, a gap between plate-shaped structure 4 and pipe 7 would be too large and contact points would be insufficient, so that heat transfer to pipe 7 would be insufficient, resulting in lower cooling capability of the cooling module.

Figure 4:
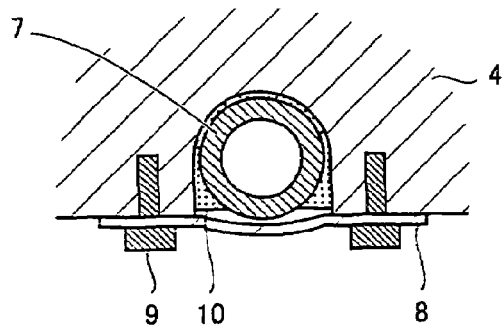
FIG. 4 is a schematic cross-section showing another specific example of a main portion of the cooling module in accordance with the present invention.

In cooling module 3 formed by combining plate-shaped structure 4 and pipe 7 in accordance with the present invention, pipe 7 may be held by a metal plate 8 and metal plate 8 may be fixed by a screw 9 on plate-shaped structure 4, as shown in FIG. 4. Preferably, stainless steel, copper, aluminum, iron or an alloy containing any of these is used as a material for metal plate 8 for holding pipe 7. By adopting this method, cooling module 3 can be formed at a low cost.

Fastening of screw 9 fixing metal plate 8 for holding pipe 7 described above is preferably managed by torque. By adjusting the degree of fastening of screw 9 by torque, uniform and firm contact between pipe 7 and plate-shaped structure 4 can be attained and, in addition, loosening of screw 9 can be suppressed during use, realizing high reliability. As to the adjustment based on torque, specifically, screw 9 for fixing metal plate 8 should preferably be fastened with the torque of at least 30 cN·m. If the torque is smaller than 30 cN·m, fastening of screw 9 might be loosened during use. An adhesive for fixing the screw may be used as needed.

Further, in cooling module 3 formed by combining plate-shaped structure 4 and pipe 7 in accordance with the present invention, caulking 10 may be provided at a contact portion between plate-shaped structure 4 and pipe 7, as shown in FIG. 4. Caulking between plate-shaped structure 4 and pipe 7 eliminates any gap, and moisture caused by dew condensation can be suppressed. As a result, corrosion between different metals becomes less likely, and a highly reliable cooling module can be obtained.

Preferably, pipe 7 of cooling module 3 described above is formed of metal. When pipe 7 is formed of metal, a cooling module having high reliability against vibration or shock and high thermal resistance can be obtained at a low cost. Further, a metal connector for connection to a duct supplying a fluid from the outside can be connected by brazing at a tip end of metal pipe 7.

Preferably, copper, stainless steel, aluminum, iron or an alloy containing any of these as a main component is used for metal pipe 7 described above. Such material is available at a low cost, allows processing including bending, and has high thermal conductivity, and therefore, a cooling module having high cooling capability can be fabricated in a simple manner. Further, by providing plating containing any of nickel, zinc, gold and phosphor on an outer circumferential surface of metal pipe 7, corrosion resistance of pipe 7 can be improved.

Plate-shaped structure 4 of cooling module 3 described above may be formed by metal, as metal is readily available and easy to process, and hence, the structure can be manufactured at a low cost. Further, metal generally has high thermal conductivity, and therefore, heat from heater body 2 is easily transferred. Thus, cooling capability of cooling module 3 can be enhanced. As the metal forming the plate-shaped structure 4, aluminum, iron, copper or an alloy containing any of these as a main component is preferred in view of thermal conductivity and cost for procurement and processing. Dependent on the environment of use, plate-shaped structure 4 may be formed of ceramics. Specifically, when it is used in an environment prone to corrosion, use of plate-shaped structure 4 formed of ceramics is effective in maintaining reliability, as corrosion becomes less likely.

Figure 6:
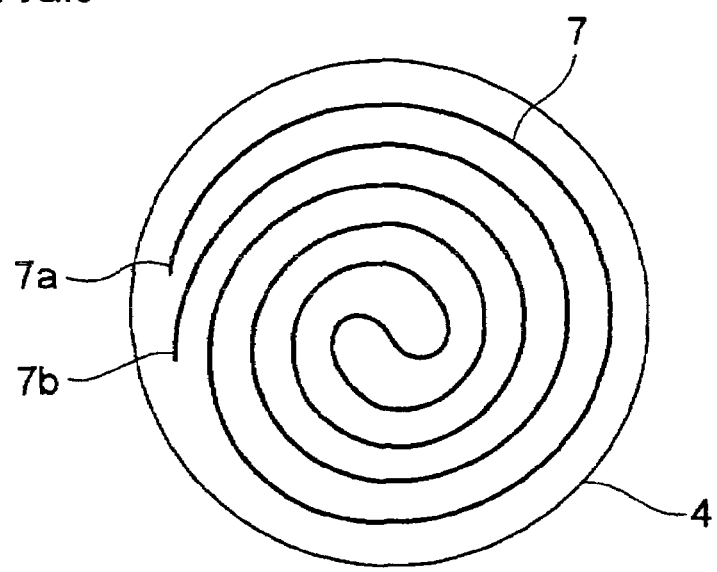
FIG. 6 is a schematic plain view showing a specific exemplary shape of a pipe of the cooling module in accordance with the present invention.
Figure 7:
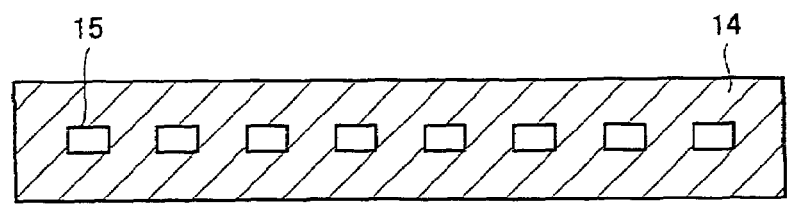
FIG. 7 is a schematic cross-section showing a cooling module of a conventional ceramic heater.

As to the shape of pipe 7 of cooling module 3 for circulation of a fluid, spirally bent arrangement is preferred, for uniform layout on plate-shaped structure 4. This allows uniform heat transfer from plate-shaped structure 4, and a cooling module capable of uniform cooling can be provided. By way of example, a spiral arrangement in which fluid inlet 7a and outlet 7b of pipe 7 are arranged close to each other and the fluid passage cross-flows in plate-shaped structure 4 such as shown in FIG. 6 realizes uniform cooling capability. The shape of arrangement of pipe 7 is not limited to the spiral shape. A pipe having continuous, alternating U shapes arranged uniformly also realizes uniform cooling capability.

In the ceramic heater in accordance with the present invention, a contact surface of heater body 2 to plate-shaped structure 4 and a contact surface of plate-shaped structure 4 to heater body 2 may both be made flat simultaneously, so that heater body 2 and plate-shaped structure 4 can be brought into uniform contact over the entire surfaces, and even when there is a portion not in contact with each other, the distance between the two contact surfaces is made uniform and small. This realizes closer contact between heater body 2 and plate-shaped structure 4 of cooling module 3 and, therefore, thermal conductivity is improved and cooling capability of cooling module 3 can be enhanced.

Specifically, regardless of the structure of heater body 2 formed of ceramics, a sum of flatness of the contact surface of heater body 2 to plate-shaped structure 4 and flatness of the contact surface of plate-shaped structure 4 to heater body 2 should preferably be at most 0.8 mm and, more preferably, at most 0.4 mm. As both contact surfaces come to have higher flatness, contact area increases and, even when there is a portion not in contact with each other, the distance between the two contact surfaces is made uniform and small. As a result, when plate-shaped structure 4 of cooling module 3 is brought into contact with heater body 2, the cooling rate is increased and, as the entire contact surface of heater body 2 is uniformly cooled, uniformity of temperature distribution of heater body 2 at the time of cooling is improved. The flatness may be measured by a measuring apparatus such as a three-dimensional measuring apparatus.

(Heater Body)

Preferably, heater body 2 has such a structure that includes a base member 2a formed of ceramics, a heater body circuit 2b formed inside, and a protective insulating layer 2c formed thereon, and a wafer as an object of processing is mounted on a main surface for heat treatment. Even when heater body 2 has such a structure, by attaining the sum of flatness of the contact surface (that is, surface of insulating layer 2c) of heater body 2 to the plate-shaped structure of cooling module 3 and flatness of the contact surface of the plate-shaped structure to heater body 2 of at most 0.8 mm as described above, the effects of uniform temperature distribution of heater body 2 and improved cooling rate can be attained. Here again, the sum of flatness of the two surfaces should more preferably be at most 0.4 mm.

The contact surfaces of heater body 2 and cooling module 3 may be flattened by known processing method such as lapping or grinding with a grinding stone. Surface roughness Ra of each surface after processing should preferably be at most 5 µm. When the contact surface of each of heater body 2 and cooling module 3 is processed to have surface roughness Ra of at most 5 µm, contact between heater body 2 and cooling module 3 is improved, and uniform temperature distribution of heater body 2 and improved cooling rate can be attained. Here, surface roughness Ra represents arithmetic mean deviation, of which detailed definition can be found, for example, in JIS B 0601.

It is noted that when the surface roughness of the contact surface of heater body 2 to cooling module 3 is refined and the surface is made closer to mirror surface, radiation ratio of the surface decreases. When the radiation ratio decreases, the amount of radiation from the surface decreases, and therefore, power consumption for heating heater body 2 can advantageously be reduced. If the base member 2a formed of ceramics of heater body 2 has high surface roughness (rough surface), dropping of ceramic particles because of friction with cooling module 3 increases, which particles have undesirable influence on the quality of the object of processing. Therefore, more preferable surface roughness Ra of ceramic base member 2a of heater body 2 is at most 1 µm.

Figure 5:
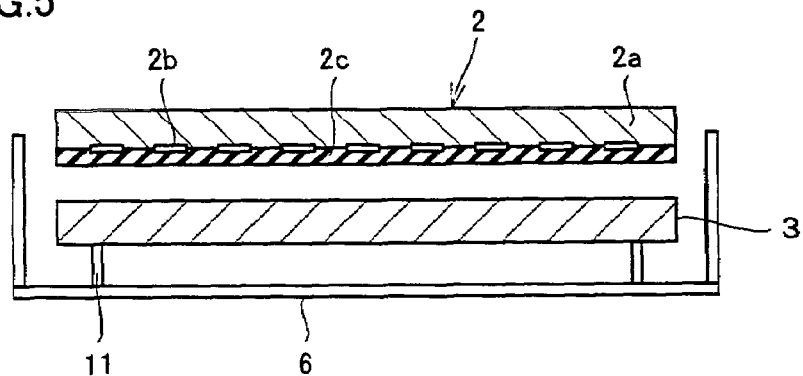
FIG. 5 is a schematic cross-section showing another specific example of the ceramic heater including a heater body and a cooling module in accordance with the present invention.

When heater body 2 has an insulating layer 2c for protecting heater body circuit 2b on a rear surface as shown in FIG. 5, too much processing for flattening the contact surface to cooling module 3 reduces the thickness of insulating layer 2c, possibly causing exposure of heater body circuit 2b and a short-circuit failure. In order to prevent such a problem, insulating film 2c may be made thicker. Insulating layer 2c, however, often has low thermal conductivity and, therefore, when it is made thick, thermal resistance increases and cooling rate decreases. Therefore, preferable thickness of insulating layer 2c is, after flattening process, at least 15 µm and at most 500 µm. Further, variation in thickness of insulating film 2c after the flattening process leads to variation in thermal resistance and variation in cooling rate, and the temperature distribution of heater body 2 tends to be uneven. Therefore, the thickness of insulating film 2c after the flattening process should desirably be uniform, and difference between the maximum thickness and minimum thickness of insulating film 2c should preferably be at most 200 µm.

Further, of the heater body 2 formed of ceramics in accordance with the present invention, preferably, the main component of ceramic base member 2a is any of aluminum nitride, silicon nitride, silicon carbide, aluminum oxide and aluminum oxinitride. When temperature distribution uniformity is given priority, aluminum nitride or silicon carbide having high thermal conductivity is preferred. When reliability is of high importance, silicon nitride is preferred as it has high strength and strong against thermal shock. When cost is of high priority, aluminum oxide is preferred. Among these ceramics, aluminum nitride (AlN) is most preferable in view of the balance between performance and cost. Use of a metal is not preferred as particles would be adhered on the wafer.

The ceramic heater in accordance with the present invention is loaded into a semiconductor manufacturing apparatus, with the heater body 2 and/or cooling module 3 contained and supported in a metal container. By way of example, heater body 2 is placed at an opening portion of container 6, as shown in FIG. 5. Further, cooling module 3 is placed in container 6 by elevating means 11 such as an air cylinder, and it can be brought into contact with and separated from heater body 2 as needed. FIG. 5 shows cooling module 3 separated from heater body 2. Further, in the plate-shaped structure of cooling module 3 and container 6, through holes (not shown) are opened, for passing a lead for power feeding to heater body 2 and leads for temperature measuring means and the like.

<Method of Forming the Ceramic Heater>

Next, the method of forming the ceramic heater will be described in detail, with reference to an example in which the material of the ceramic base member is AlN.

(1) Fabrication of Base Member

First, to aluminum nitride (AlN) raw material powder and sintering agent powder added as needed, a prescribed amount of solvent, a binder, and a dispersing agent or a deflocculant as needed are added and mixed, whereby raw material slurry is prepared. The raw material powder of AlN having specific surface area of 2.0 to 5.0 $m^2/g$ is preferred. When the specific surface area is smaller than 2.0 $m^2/g$, sintering characteristic of AlN degrades, and when it exceeds 5.0 $m^2/g$, powder aggregation is too strong, and handling of the material becomes difficult. Further, the amount of oxygen contained in the raw material AlN powder is preferably at most 2% by weight. When the amount of oxygen exceeds 2% by weight, thermal conductivity of the sintered body decreases. The amount of metal impurity other than aluminum contained in the raw material powder is preferably at most 2000 ppm. If the amount of metal impurity exceeds this range, thermal conductivity of the sintered body decreases. Particularly, a IV-group element such as Si and an iron group element such as Fe have high function of decreasing thermal conductivity of the sintered body, and therefore, each content should preferably be at most 500 ppm.

Further, AlN is a sintering-resistant material, and therefore, addition of sintering agent to the AlN raw material powder is preferred. Preferable sintering agent to be added is a rare-earth element compound. The rare-earth element compound reacts on aluminum oxide or aluminum oxinitride at the surface of AlN powder particle during sintering, and promotes densification of AlN and removes oxygen as a cause of lower thermal conductivity of the AlN sintered body. Thus, the thermal conductivity of the resulting AlN sintered body can be improved.

Preferably, the amount of addition of the rare-earth element compound as the sintering agent is in the range of 0.01 to 5% by weight. If the amount of addition is smaller than 0.01% by weight, it is difficult to obtain a dense sintered body and thermal conductivity of the sintered body would be low. If it exceeds 5% by weight, the sintering agent would be present at the grain boundary of AlN sintered body, and when used in a corrosive atmosphere, the sintering agent existing at the grain boundary would be etched, causing grain separation or particles. More preferably, the amount of addition of the sintering agent is at most 1% by weight. When it is at most 1% by weight, sintering agent would not be present at the triple point of the grain boundary, and hence, corrosion resistance is improved.

Among the rare-earth element compound described above, yttrium compound that has particularly notable function of removing oxygen is preferred. As the rare-earth element compound, an oxide, nitride, fluoride or stearate compound of rare earth may be used. Among these, rare-earth oxide is preferred as it is inexpensive and readily available. Further, rare-earth stearate compound has high affinity for organic solvent, and therefore, it is particularly suitable when the AlN raw material powder and the sintering agent are mixed by using an organic solvent, as it attains good mixing characteristic.

To the AlN raw material powder and sintering agent powder as described above, a prescribed amount of solvent and a binder are added, and a dispersing agent and/or a deflocculant as needed is added and mixed, whereby raw material slurry is prepared. The method of mixing may be ball mill mixing or ultra-sonic mixing. Next, the resulting raw material slurry is molded and sintered, whereby an AlN sintered body is obtained. Two methods, that is, co-firing and post-metallization are available for this process, and here, first, an example using the post-metallization will be described.

First, by spray dryer method or the like, the raw material slurry granules are formed. The granules are put in a prescribed mold and by press molding, a molded body is obtained. Here, when the pressure for pressing is lower than 9.8 MPa, it is difficult to attain sufficient strength of the molded body and the body tends to be damaged during handling. Therefore, pressure for pressing should desirably be at least 9.8 MPa.

Though it depends on the binder content or amount of added sintered agent, the density of the molded body should preferably be 1.5 to 2.5 g/cm$^3$. If the density of the molded body is smaller than 1.5 g/cm$^3$, distance between grains of the raw material powder becomes relatively large, and therefore progress of sintering becomes difficult. If the density of the molded body exceeds 2.5 g/cm3, it becomes difficult to sufficiently remove the binder in the molded body in the following step of degreasing, and hence, it becomes difficult to obtain a dense sintered body such as described above.

Next, the molded body is heated in a non-oxidizing atmosphere, for degreasing. As the non-oxidizing atmosphere gas, nitrogen or argon is preferred. When degreasing is performed in an oxidizing atmosphere such as in the air, the surface of AlN powder is oxidized, and the thermal conductivity of the sintered body decreases. Preferably, the heating temperature for degreasing is at least 500° C. and at most 1000° C. If the temperature is lower than 500° C., the binder cannot be sufficiently removed, and carbon remains excessively in the molded body after degreasing, so that sintering in the subsequent step is hindered. If the temperature exceeds 1000° C., the amount of remaining carbon would be too small, and the function of removing oxygen of an oxide film existing at the surface of AlN powder degrades, so that thermal conductivity of the sintered body decreases. The amount of carbon left in the molded body after degreasing should preferably be at most 1.0% by weight. If carbon remains by more than 1.0% by weight, sintering is hindered and a dense sintered body cannot be obtained.

Next, the molded body is sintered. Sintering is done in a non-oxidizing atmosphere of nitrogen or argon, at a temperature of 1700 to 2000° C. At this time, dew point of non-oxidizing atmosphere gas used here should preferably be −30° C. or lower. If the atmosphere gas contains more moisture, AlN reacts on the moisture in the atmosphere gas at the time of sintering, forming an oxinitride, and therefore, the thermal conductivity may possibly be decreased. Further, the amount of oxygen in the atmosphere gas is preferably at most 0.001% by volume. If the amount of oxygen is large, the surface of AlN is oxidized, possibly decreasing thermal conductivity.

Further, a suitable jig used at the time of sintering is a boron nitride (BN) molded body. The BN molded body has sufficient thermal resistance at the sintering temperature mentioned above, and its surface has solid lubrication. Therefore, friction between the jig and the molded body can be reduced when the molded body contracts at the time of sintering, and hence, a sintered body without distortion can be obtained.

The resulting sintered body, that is, the base member $2a$ is processed as needed. For the next step of screen-printing a conductive paste, the surface roughness Ra of the sintered body, that is, base member $2a$, should preferably be at most 5 μm. When the surface roughness Ra exceeds 5 μm, defects such as pattern blurring or pinholes tend to occur when the circuit is formed by screen-printing. Surface roughness Ra of at most 1 μm is more suitable.

Polishing to attain the surface roughness as such should be performed naturally on both surfaces when both surfaces of the sintered body are subjected to screen-printing. Even when only one surface is subjected to screen-printing, polishing should be performed not only on the surface to be screen-printed but also on the opposite surface. When only the surface to be screen-printed is polished, it follows that the un-polished surface is used for supporting the sintered body at the time of screen-printing. In that case, the un-polished surface may have a projection or foreign matter, which leads to unstable fixing of the sintered body, and the circuit pattern would not be drawn successfully by screen-printing.

In the polishing process described above, preferably, the parallelism between both processed surfaces of the sintered body should be at most 0.5 mm. When the parallelism exceeds 0.5 mm, thickness of the conductive paste might be varied significantly at the time of screen-printing. Parallelism of at most 0.1 mm is particularly suitable. Further, the flatness of the surface to be screen-printed should preferably be at most 0.5 mm. When the flatness exceeds 0.5 mm, again the thickness of the conductive paste might be varied significantly. Flatness of at most 0.1 mm is particularly suitable.

Parallelism and flatness can be measured using a three-dimensional measuring apparatus or the like.

(2) Formation of Heater Body Circuit

On the polished sintered body (base member 2a) described above, a conductive paste is applied by screen-printing, to form an electric circuit, that is, a heater body circuit 2b. The conductive paste may be obtained by mixing, with a metal powder, an oxide powder, a binder and a solvent as needed. Considering matching in coefficient of thermal expansion with the ceramics, tungsten, molybdenum or tantalum is preferred as the metal powder. In order to improve contact strength with AlN, oxide powder may be added. Preferable oxide powder includes an oxide of IIA-group element or IIIA-group element, $Al_2O_3$, or $SiO_2$. Yttrium oxide is particularly preferred as it has very good wettability to AlN. Preferably, the oxide is added by the amount of 0.1 to 30% by weight. If the amount is smaller than 0.1% by weight, contact strength between the metal layer as the formed electric circuit, that is, heater body circuit 2b and AlN lowers. If the amount exceeds 30% by weight, the metal layer as the electric circuit comes to have high electric resistance.

Preferably, the conductive paste has the thickness of 5 to 100 μm after drying. When the thickness is smaller than 5 μm, electric resistance becomes too high and contact strength lowers. Further, preferably, a pattern space of the circuit pattern formed for the heater body circuit 2b should be at least 0.1 mm. If the space is smaller than 0.1 mm, leakage current may possibly cause short-circuit, dependent on the applied voltage or temperature, when a current is caused to flow through heater body circuit 2b. Particularly, when it is used at a temperature of 500° C. or higher, the pattern space should preferably be at least 1 mm, and more preferably at least 3 mm.

Next, the conductive paste is degreased and fired to form an electric circuit, that is, the heater body circuit 2b. Degreasing of conductive paste is performed in a non-oxidizing atmosphere of nitrogen or argon. Preferably, the degreasing temperature is at least 500° C. If the degreasing temperature is lower than 500° C., the binder in the conductive paste cannot be sufficiently removed and carbon remains in the metal layer and forms metal carbide at the time of firing. Thus, the metal layer comes to have higher electric resistance.

Further, firing of the conductive paste is preferably performed in a non-oxidizing atmosphere of nitrogen or argon at a temperature of at least 1500° C. If the temperature is lower than 1500° C., grain growth of metal powder in the conductive paste does not proceed, and therefore, electric resistance of the metal layer after firing becomes too high. The firing temperature should not exceed the sintering temperature of ceramics. When the conductive paste is fired at a temperature exceeding the sintering temperature of ceramics, the sintering agent or the like contained in the ceramics starts to evaporate, and grain growth of metal powder in the conductive paste is promoted, so that contact strength between the ceramics and the metal layer would be decreased.

(3) Formation of Insulating Layer

Next, in order to ensure insulation of the thus formed metal layer, that is, the heater body circuit 2b, an insulating layer 2c may be formed on the metal layer. The material for insulating layer 2c is not specifically limited, provided that the material has low reactivity on the electric circuit and the difference in coefficient of thermal expansion from AlN is at most $5.0 \times 10^{-6}$/K. By way of example, crystallized glass or AlN may be used. By preparing a paste of such a material, performing screen-printing of a prescribed thickness, degreasing as needed and by firing at a prescribed temperature, insulating layer 2c can be formed.

Though not shown in FIG. 5, a ceramic substrate may further be stacked on base member 2a, as needed. The ceramic substrate may be stacked using a bonding agent. As the bonding agent, a paste prepared by adding, to aluminum oxide powder or aluminum nitride powder, an IIA-group element compound or IIIA-group element compound, a binder and a solvent may be used, which paste is applied to the bonding surface through screen-printing or other method. The thickness of the bonding agent to be applied is not specifically limited, though the thickness of at least 5 μm is preferred. When the thickness is smaller than 5 μm, bonding defects such as pinholes or unevenness tend to occur at the bonding layer.

The ceramic substrate having the bonding agent applied thereto is subjected to degreasing in a non-oxidizing atmosphere at a temperature of at least 500° C. Thereafter, the ceramic substrate to be stacked, that is, base member 2a is overlapped, a prescribed load is applied, and heated in a non-oxidizing atmosphere, so that ceramic substrates are joined to each other. The load at this time should preferably be at least 5 kPa. If the load is smaller than 5 kPa, sufficient bonding strength is not attained, or bonding defects mentioned above tend to generate. The temperature is not specifically limited, provided that sufficiently close contact can be attained between the ceramic substrates with the bonding layer interposed. Preferable temperature is at least 1500° C. If the temperature is lower than 1500° C., it is difficult to attain sufficient bonding strength, and bonding defects tend to generate. Preferably, nitrogen or argon is used for the non-oxidizing atmosphere at the time of degreasing and bonding described above.

The ceramic stacked sintered body to be heater body 2 can be obtained in the manner described above. As the electric circuit, in place of the conductive paste described above, a molybdenum line (coil) may be used for a heater circuit, or a molybdenum or tungsten mesh (net-like body) may be used for an electrostatic absorption electrode or RF electrode. In that case, the molybdenum coil or mesh mentioned above may be embedded in the AlN raw material powder to be subjected to hot pressing for fabrication. The temperature and atmosphere for the hot press may be set in accordance with the sintering temperature and sintering atmosphere of AlN. It is noted, however, that the preferable pressure for hot press is at least 0.98 MPa. If the pressure is lower than 0.98 MPa, a gap might possibly be formed between the molybdenum coil or mesh and AlN, and the performance as a heater or wafer holding body would not be attained.

Next, a method of fabricating heater body 2 using the co-fire method will be described. First, the raw material slurry described above is formed into a sheet by doctor-blade method. Though there is no specific limitation for sheet formation, preferable thickness of the sheet is at most 3 mm after drying. If the thickness of the sheet exceeds 3 mm, drying shrinkage of the slurry would be too large, and possibility of cracks generated in the sheet becomes higher.

Then, on the sheet, a conductive paste is applied, for example, by screen-printing, whereby a metal layer to be an electric circuit of a prescribed shape is formed. As the conductive paste, the one used for the post metallization method may be used. It is noted, however, that in the co-fire method, there is not much influence even when the oxide powder is not added to the conductive paste.

Next, a sheet having the circuit formed thereon and a sheet not having any circuit thereon are stacked. As to the method of stacking, each sheet is set at a prescribed position and overlapped. At this time, a solvent is applied between each of the sheets, as needed. The sheets in the overlapped state are heated as needed. For heating, preferable temperature is at most 150° C. If the sheets were heated to a higher temperature, the stacked sheets would be deformed significantly. Thereafter, the stacked sheets are pressed to be integrated. The applied pressure is preferably in the range of 1 to 100 MPa. If the pressure is smaller than 1 MPa, the sheets would not be sufficiently integrated and might be separated in the subsequent process steps. If the pressure exceeding 100 MPa is applied, the amount of deformation of the sheet would be too large and not preferable.

Next, the stacked sheet body is subjected to degreasing and sintering in the similar manner as in the post metallization method described above, whereby a base member 2a having heater body circuit 2b formed thereon is obtained. The temperature, amount of carbon and the like for degreasing and sintering are the same as those of the post metallization method. When the conductive paste is printed on the sheet, it is possible to print a heater circuit, an electrostatic absorption electrode and the like on a plurality of sheets respectively, and to stack the sheets, so that a heater having a plurality of electric circuits can be formed in a simple manner. When the electric circuit such as heater body circuit 2b is formed on an outermost layer of the ceramic stacked body, an insulating layer 2c may be formed on the electric circuit as in the post metallization method described above, in order to protect and ensure insulation of the electric circuit. In this manner, the ceramic stacked sintered body to be heater body 2 can be obtained.

The obtained ceramic stacked sintered body as heater body 2 is processed as needed. Typically, the body in the sintered state does not satisfy the accuracy required for a semiconductor manufacturing apparatus. The body is preferably processed such that the flatness of the wafer-mounting surface for mounting the wafer as the object of processing is at most 0.5 mm, and more preferably such that the flatness is at most 0.1 mm. If the flatness exceeds 0.5 mm, a gap is more likely formed between the wafer and heater body 2, and the heat of heater body 2 would not be uniformly transferred to the wafer, so that temperature of the wafer would more likely be uneven.

Further, the surface roughness Ra of wafer-mounting surface is preferably at most 5 μm. If the surface roughness Ra exceeds 5 μm, dropping of AlN grains may possibly increase, because of friction between heater body 2 and the object of processing. The grains dropped would be particles that have adverse influence on processing such as film formation on the wafer or etching. More preferable surface roughness Ra is at most 1 μm.

EXAMPLES

As shown in FIG. 5, a ceramic heater including a heater body 2 formed of ceramic base member 2a, heater body circuit 2b and insulating layer 2c, and cooling module 3, which is brought into contact with heater body 2 for cooling heater body 2, was fabricated.

As base member 2a of heater body 2, an aluminum nitride (AlN) sintered body having the diameter of 330 mm and thickness of 12 mm was used. On a rear surface of base member 2a, a conductive paste was applied by screen-printing and then fired, to form heater body circuit 2b, and further, insulating layer 2c for protecting heater body circuit 2b was formed. Considering matching of thermal expansion coefficient with ceramics, the conductive paste was prepared using tungsten powder as the metal powder, with oxide powder, a binder and a solvent mixed as needed. As for insulating layer 2c, a paste prepared by adding an organic solvent and a binder to glass powder was applied by screen-printing and then fired, to form the insulating layer 2c.

Cooling module 3 was fabricated by combining plate-shaped structure 4 with pipe 7. As plate-shaped structure 4, an aluminum disk having the diameter of 330 mm and the thickness of 10 mm was used. Further, as pipe 7, a pipe formed of dephosphorized copper having an outer diameter of 6 mm and an inner diameter of 4 mm was used The pipe 7 formed of copper was bent spirally as shown in FIG. 6. Specifically, the pipe extends from the outer side to the inner side of the spiral, bent to form a U-shape at the center of the spiral, and extends from the central portion to the outer side in a cross-flow. Connectors formed of stainless steel were brazed to opposite ends of copper pipe 7. The connector is made hollow, allowing supply or discharge of a fluid to and from copper pipe 7. After the connectors were brazed to opposite ends of copper pipe 7, the outer circumference of copper pipe 7, the connectors and the brazed portions were provided with nickel-phosphor (Ni—P) plating.

On a rear surface of plate-shaped structure 4 formed of the aluminum disk described above, a trench having the width of 6.5 mm and depth of 5 mm was formed to have a track corresponding to the spiral shape of copper pipe 7 described above. The bottom of the trench is formed to have a radius of 3.3 mm to conform to the shape of copper pipe 7. Copper pipe 7 was fitted in the trench of plate-shaped structure 4, and thereafter, copper pipe 7 was held by a metal plate 8 of stainless steel and fixed on plate-shaped structure 4 by means of screws 9, as shown in FIG. 4. Screw 9 was fastened with the torque of 100 cN·m. Thereafter, at the contact portion between copper pipe 7 and plate-shaped structure 4, caulking 10 was provided, by applying and filling caulking resin.

Further, the rear surface (insulating layer 2c) of heater body 2 and the surface (on the side not having the copper pipe 7) of plate-shaped structure 4 were processed such that the sum of the flatness of contact surface of heater body 2 to be in contact with plate-shaped structure 4 of cooling module 3, that is, surface of the insulating layer 2c protecting heater body circuit 2b and flatness of contact surface (front surface) of plate-shaped structure 4 to be in contact with heater body 2 attained to 0.8 mm. Further, the surface roughness Ra of the contact surfaces of plate-shaped structure 4 and heater body 2 was made 0.1 μm, and the radiation ratio of the contact surfaces was set to at most 0.1.

Cooling module 3 and heater body 2 described above were put in stainless steel container 6 having the diameter of 240 mm and the depth of 35 mm. Specifically, on a bottom portion of stainless container 6, an air cylinder as elevating means 11 was mounted, and at a tip end of elevating means 11, cooling module 3 was fixed. Elevating means 11 is capable of moving cooling module 3 upward/downward, so that the cooling module 3 can be brought into contact with or separated from the rear surface, opposite to the wafer-mounting surface, of heater body 2. Cooling module 3 formed in this manner will be referred to as CP1.

Cooling test was conducted using the ceramic heater. In the cooling test, cooling was done under two different conditions, that is, (1) heater body 2 at 240° C. was cooled to 150° C. and (2) heater body 2 at 180° C. was cooled to 120° C., and the width of temperature distribution (thermal uniformity) of the ceramic heater as a whole and the time necessary for cooling were measured. The cooling operation was done by pressing cooling module 3 having water of 25° C. circulated at a rate of 1 L/min through pipe 7 onto the rear surface of heater body 2. Thermal uniformity and temperature of cooling were measured by placing a 17-point wafer for temperature measurement on heater body 2 and using temperature measuring elements thereof. Specifically, thermal uniformity was measured from temperature distribution at 17 points, after the heater body 2 was cooled to (1) 150° C. and (2) 120° C. by pressing cooling module 3 thereto. The temperature during cooling was measured as an average value of temperatures at 17 points.

In addition to the cooling module 3 (CP1) described above, cooling modules were fabricated under various conditions, and cooling test was conducted. In the following, the results of cooling test performed on the ceramic heater using these cooling modules 3 will be described.

Example 1

In addition to the cooling module (CP1), a cooling module (CP2) formed only of a plate-shaped structure 4 of an aluminum disk having the diameter of 330 mm and thickness of 10 mm was prepared. Cooling test was done on ceramic heaters having these two different cooling modules, and the results are as shown in Table 1 below. The reference for determining "cooling performance evaluation" in Tables 1 to 4 are as follows.

A: necessary cooling time from 240° C. to 150° C. is shorter than 90 sec., and necessary cooling time from 180° C. to 120° C. is shorter than 60 sec.

B: necessary cooling time from 240° C. to 150° C. is shorter than 118 sec., and necessary cooling time from 180° C. to 120° C. is shorter than 88 sec.

C: necessary cooling time from 240° C. to 150° C. is shorter than 146 sec., and necessary cooling time from 180° C. to 120° C. is shorter than 116 sec.

D: necessary cooling time from 240° C. to 150° C. is not shorter than 146 sec., and necessary cooling time from 180° C. to 120° C. is not shorter than 116 sec.

TABLE 1

| | Pipe of cooling module | Cooling from 240° C. to 150° C. | | | Cooling from 180° C. to 120° C. | | |
|---|---|---|---|---|---|---|---|
| | | thermal uniformity (° C.) | cooling time (sec) | cooling performance evaluation | thermal uniformity (° C.) | cooling time (sec) | cooling performance evaluation |
| CP1 | with pipe | 23.9 | 80 | A | 8.6 | 54 | A |
| CP2 | without pipe | 40.4 | 354 | D | 12.3 | 334 | D |

Example 2

In addition to the cooling module (CP1) described above, three cooling modules (CP3 to CP5) were formed in which only the depth of trenches formed in plate-shaped structure 4 of aluminum disk were made different. Cooling test was done on ceramic heaters having these four different cooling modules, and the results are as shown in Table 2 below. As can be seen from Table 2, good cooling characteristics were attained when the depth of the trench was made the same or deeper than the outer radius (3 mm) of the pipe.

TABLE 2

| | Trench depth of plate-shaped structure | Cooling from 240° C. to 150° C. | | | Cooling from 180° C. to 120° C. | | |
|---|---|---|---|---|---|---|---|
| | | thermal uniformity (° C.) | cooling time (sec) | cooling performance evaluation | thermal uniformity (° C.) | cooling time (sec) | cooling performance evaluation |
| CP1 | 5 mm | 23.9 | 80 | A | 8.6 | 54 | A |
| CP3 | no trench | 25.2 | 126 | C | 10.2 | 99 | C |
| CP4 | 2 mm | 25.7 | 98 | B | 10.7 | 71 | B |
| CP5 | 7 mm | 23.6 | 78 | A | 8.7 | 51 | A |

Example 3

In addition to the cooling module (CP1) described above, four different cooling modules (CP6 to CP9) were fabricated, in which only the difference between the trench width and the pipe outer diameter (6 mm) was made different by changing the width of the trench formed in plate-shaped structure of aluminum disk. Cooling test was done on ceramic heaters having these five different cooling modules, and the results are as shown in Table 3 below. As can be seen from Table 3, when the difference between the trench width of plate-shaped structure 4 and the outer diameter of the pipe was in the range of 0.2 to 1.0 mm, good cooling characteristics could be attained.

TABLE 3

|  | Difference between trench width and pipe diameter (6 mm) | Cooling from 240° C. to 150° C. ||| Cooling from 180° C. to 120° C. |||
| --- | --- | --- | --- | --- | --- | --- | --- |
|  |  | thermal uniformity (° C.) | cooling time (sec) | cooling performance evaluation | thermal uniformity (° C.) | cooling time (sec) | cooling performance evaluation |
| CP1 | 0.5 mm | 23.9 | 80 | A | 8.6 | 54 | A |
| CP6 | 0.1 mm | 25.2 | 104 | B | 10.2 | 74 | B |
| CP7 | 0.2 mm | 23.6 | 81 | A | 8.5 | 54 | A |
| CP8 | 1.1 mm | 24.9 | 109 | B | 10.1 | 79 | B |
| CP9 | 1.3 mm | 23.6 | 118 | C | 11.2 | 88 | C |

Example 4

In addition to the cooling module (CP1) described above, four different cooling modules (CP10 to CP13) were fabricated, in which only the sum of flatness of contact surfaces of plate-shaped structure 4 of aluminum disk and heater body 2 was made different by processing the two contact surfaces. Cooling test was done on ceramic heaters having these five different cooling modules, and the results are as shown in Table 4 below. As can be seen from Table 4, when the sum of flatness of the two contact surfaces was made at most 0.8 mm, good cooling characteristics could be attained.

TABLE 4

|  | Sum of flatness of contact surfaces | Cooling from 240° C. to 150° C. ||| Cooling from 180° C. to 120° C. |||
| --- | --- | --- | --- | --- | --- | --- | --- |
|  |  | thermal uniformity (° C.) | cooling time (sec) | cooling performance evaluation | thermal uniformity (° C.) | cooling time (sec) | cooling performance evaluation |
| CP1 | 0.8 mm | 23.9 | 80 | A | 8.6 | 54 | A |
| CP10 | 0.4 mm | 23.2 | 75 | A | 8.0 | 49 | A |
| CP11 | 0.6 mm | 23.5 | 76 | A | 8.1 | 50 | A |
| CP12 | 1.0 mm | 25.0 | 116 | B | 9.8 | 87 | B |
| CP13 | 1.2 mm | 26.7 | 123 | C | 10.1 | 91 | C |

Example 5

In addition to the cooling module (CP1) described above, five different cooling modules (CP14 to CP18) were fabricated, in which Ni—P plating was provided/not provided on outer circumferential surface of copper pipe 7, caulking 10 was provided/not provided at the gap between copper pipe 7 and plate-shaped structure 4, and fastening torque of copper pipe 7 to plate-shaped structure 4 was changed. Cooling test was done on ceramic heaters having these six different cooling modules, states of the outer circumferential surface of copper pipe 7 after six month and after one year were observed, and the results were as shown in Table 5 below.

TABLE 5

|  | Pipe plating | Caulking | Screw fastening torque | State of pipe outer circumference ||
| --- | --- | --- | --- | --- | --- |
|  |  |  |  | after 6 months | after 1 year |
| CP1 | plated | caulked | 100 cN · m | no variation | no variation |
| CP14 | not plated | caulked | 100 cN · m | no variation | tone changed |

TABLE 5-continued

| | Pipe plating | Caulking | Screw fastening torque | State of pipe outer circumference after 6 months | after 1 year |
|---|---|---|---|---|---|
| CP15 | plated | caulked | 10 cN·m | no variation | screw loosened |
| CP16 | plated | caulked | 40 cN·m | no variation | no variation |
| CP17 | plated | caulked | 70 cN·m | no variation | no variation |
| CP18 | plated | not caulked | 100 cN·m | no variation | partially tarnished |

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A ceramic heater, comprising:
   a heater body formed of ceramics on which an object to be processed is mounted and heated; and
   a cooling module which can be brought into contact with the heater body for cooling the heater body;
   wherein the cooling module is formed by combining a plate-shaped structure that can be brought into contact with the heater body and a pipe allowing circulation of a fluid, the pipe is arranged in a trench formed in the plate-shaped structure, and
   the cooling module further has a metal plate for holding the pipe on the plate-shaped structure, the metal plate is fixed on the plate-shaped structure by a screw.

2. The ceramic heater according to claim 1, wherein depth of said trench is at least an outer radius of said pipe.

3. The ceramic heater according to claim 1, wherein difference between width of said trench and an outer diameter of said pipe is 0.2 mm to 1.0 mm.

4. The ceramic heater according to claim 1, wherein fastening of said screw fixing said metal plate is managed by torque.

5. The ceramic heater according to claim 1, wherein the screw fixing said metal plate is fastened with a torque of at least 30 cN·m.

6. The ceramic heater according to claim 1, wherein said metal plate is formed of stainless steel, copper, aluminum, iron or an alloy containing any of these.

7. The ceramic heater according to claim 1, wherein a contact portion between said plate-shaped structure and said pipe is caulked.

8. The ceramic heater according to claim 1, wherein said pipe is formed of metal.

9. The ceramic heater according to claim 8, wherein a metal connector is connected by brazing to a tip end of said pipe.

10. The ceramic heater according to claim 8, wherein said pipe is formed of copper, stainless steel, aluminum, iron or an alloy containing any of these as a main component.

11. The ceramic heater according to claim 8, wherein an outer circumference of said pipe is provided with plating containing any of nickel, zinc, gold and phosphor.

12. The ceramic heater according to claim 1, wherein said plate-shaped structure is formed of metal.

13. The ceramic heater according to claim 12, wherein said plate-shaped structure is formed of aluminum, iron, copper or an alloy containing any of these as a main component.

14. The ceramic heater according to claim 1, wherein said plate-shaped structure is formed of ceramics.

15. The ceramic heater according to claim 1, wherein sum of flatness of a contact surface of said heater body to said plate-shaped structure and flatness of a contact surface of said plate-shaped structure to said heater body is at most 0.8 mm.

16. The ceramic heater according to claim 1, wherein said pipe is arranged in a spiral in said cooling module.

17. The ceramic heater according to claim 1, wherein said pipe is arranged in continuous alternating U-shapes in said cooling module.

18. The ceramic heater according to claim 1, wherein main component of a base member of said heater body is any of aluminum nitride, silicon nitride, silicon carbide, aluminum oxide and aluminum oxynitride.

19. The ceramic heater according to claim 18, wherein main component of a base member of said heater body is aluminum nitride.

20. The ceramic heater according to claim 1, wherein said heater body and/or said cooling module is contained in a metal container.

21. A semiconductor manufacturing apparatus, mounting the ceramic heater according to claim 1.

* * * * *